(12) United States Patent  
Agapi et al.

(10) Patent No.: US 7,356,130 B2
(45) Date of Patent: Apr. 8, 2008

(54) METHOD AND SYSTEM FOR SELECTING SPEECH OR DTMF INTERFACES OR A MIXTURE OF BOTH

(75) Inventors: Ciprian Agapi, Lake Worth, FL (US); Felipe Gomez, Lake Worth, FL (US); James Robert Lewis, Delray Beach, FL (US)

(73) Assignee: International Business Machines Corporation, Armonk, NY (US)

( * ) Notice: Subject to any disclaimer, the term of this patent is extended or adjusted under 35 U.S.C. 154(b) by 310 days.

(21) Appl. No.: 11/026,720

(22) Filed: Dec. 30, 2004

(65) Prior Publication Data
US 2005/0169440 A1    Aug. 4, 2005

(51) Int. Cl.
*H04M 1/64* (2006.01)
(52) U.S. Cl. .......................................... 379/77; 704/275
(58) Field of Classification Search ............. 379/88.04, 379/88.01, 88.03, 351, 77; 704/275, 200, 704/251, 270
See application file for complete search history.

(56) References Cited

U.S. PATENT DOCUMENTS

| | | | |
|---|---|---|---|
| 5,737,393 A * | 4/1998 | Wolf ........................ 379/88.13 |
| 5,884,262 A | 3/1999 | Wise et al. |
| 5,949,887 A | 9/1999 | Fado et al. |
| 6,041,301 A | 3/2000 | Fado et al. |
| 6,058,166 A * | 5/2000 | Osder et al. ............. 379/88.22 |
| 6,094,476 A * | 7/2000 | Hunt et al. .............. 379/88.04 |
| 6,138,100 A | 10/2000 | Dutton et al. |
| 6,173,266 B1 * | 1/2001 | Marx et al. ................. 704/270 |
| 6,246,990 B1 | 6/2001 | Happ |
| 6,493,434 B1 | 12/2002 | Desmond et al. |
| 6,560,576 B1 | 5/2003 | Cohen et al. |
| 7,120,234 B1 * | 10/2006 | Quinn et al. ............. 379/88.04 |
| 2003/0032409 A1 | 2/2003 | Hutcheso et al. |
| 2003/0078779 A1 | 4/2003 | Desai et al. |

* cited by examiner

*Primary Examiner*—Olisa Anwah
(74) *Attorney, Agent, or Firm*—Patents On Demand, P.A.; Brian K. Buchheit

(57) ABSTRACT

A wizard that from a fixed design can create various audio interfaces. The generated interfaces can be speech only, DTMF only, or various mixed speech and DTMF UIs. When specifying both speech and DTMF prompts, a number of combinations of these interfaces could be automatically generated. Robust speech recognition systems can be built by automatically generating a "shadow" DTMF application. The DTMF application will perform the same task as the primary speech application; however the transfer to a DTMF application could be done explicitly by the user, or could be transferred automatically (either a temporary or permanent transition) at a point in the call flow where there was a problem with the speech recognition.

3 Claims, 2 Drawing Sheets

METHOD AND SYSTEM FOR SELECTING SPEECH OR DTMF INTERFACES OR A MIXTURE OF BOTH

BACKGROUND OF THE INVENTION

1. Statement of the Technical Field

The present invention relates to the field of user interfaces to computer systems that are capable of responding to audio input, e.g., speech or touch-tone phones.

2. Description of the Related Art

Traditionally, audio interfaces have been built by programmers by hand, and the "sound and feel" of an application was fixed at design-time. With automated code generation wizards for audio user interfaces, code for the two most common sound user interfaces (DTMF only, or speech only applications) can be generated. While this greatly enhances the time-to-market of an audio application, currently there are no wizards that generate mixed interface (DTMF and voice) applications. Mixed interface applications can be designed in a variety of ways, by employing the two interfaces at convenient times. A design that uses a mix of speech and DTMF (Dual Tone Multi-Frequency) input, the system used by touch-tone telephone interfaces, can solve problems that are not otherwise tractable in either DTMF or voice user interface alone. For example, when there is a problem with the speech recognition response, it is advantageous to allow the interface to DTMF, or to design the program to automatically respond to the recognition problem by switching to DTMF. Accordingly, it is desirable to provide a method and system that provides developers of interactive voice response systems the capability to easily enable either voice or DTMF or a mix of the two from a single high-level application call flow design, as will be explained in detail below.

SUMMARY OF THE INVENTION

The present invention addresses the deficiencies of the art with respect to managing events in interactive speech applications and provides a novel and non-obvious method, system and apparatus for preselecting speech, DTMF or a mix of interface styles for an audio interactive system. In particular, in accordance with the principals of the present invention, an interface may be presented to a user (for example, an application developer) through a wizard, allowing the user to select from a variety of styles, wherein the style selected responds to the requirements as determined by the user. Notably, the user may select a particular style, amend the selected style, and/or choose a different style, to suit the user's needs for a particular interactive audio application environment.

The invention provides a method of defining standard speech/DTMF mixed user Interface styles used in generating speech application code for managing the user Interface (UI) presentation in applications that can support both speech recognition and DTMF (touchtone) telephone key input, the method comprising the steps of: presenting a Speech/DTMF style-selection menu that allows for selection of one or more UI styles, each UI style corresponding to a system response to a code-generation request; and upon selection of a UI style, preparing the system response for a code generation request.

Methods consistent with this invention provide a wizard that from a fixed design can create various audio interfaces. The generated interfaces can be speech only, DTMF only, or various mixed speech and DTMF user interfaces, and includes the means for automatically generating these different interface styles from the same source information given the selection of the style from a style-selection wizard panel.

In still another aspect, the present invention provides a computer readable storage medium storing a computer program which when executed defines styles used in interactive audio events. The styles are defined by presenting a style-selection menu that allows for selection of one or more styles. Each style corresponds to a system or user input. Upon selection of a style, a system response for a code generation request is prepared.

Additional aspects of the invention will be set forth in part in the description which follows, and in part will be obvious from the description, or may be learned by practice of the invention. The aspects of the invention will be realized and attained by means of the elements and combinations particularly pointed out in the appended claims. It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute part of this specification, illustrate embodiments of the invention and together with the description, serve to explain the principles of the invention. The embodiments illustrated herein are presently preferred, it being understood, however, that the invention is not limited to the precise arrangements shown, wherein.

DETAILED DESCRIPTION OF THE PREFERRED EMBODIMENTS

The present invention is a system and method for, when specifying both speech and DTMF prompts, a number of combinations of these interfaces that could be automatically generated. Robust speech recognition systems can be built by automatically generating a "shadow" DTMF application. The DTMF application will perform the same task as the primary speech application; however the transfer to a DTMF application could be done explicitly by the user, or could be automatically transferred at a point in the call flow where there was a problem with the speech recognition.

Figure 1:
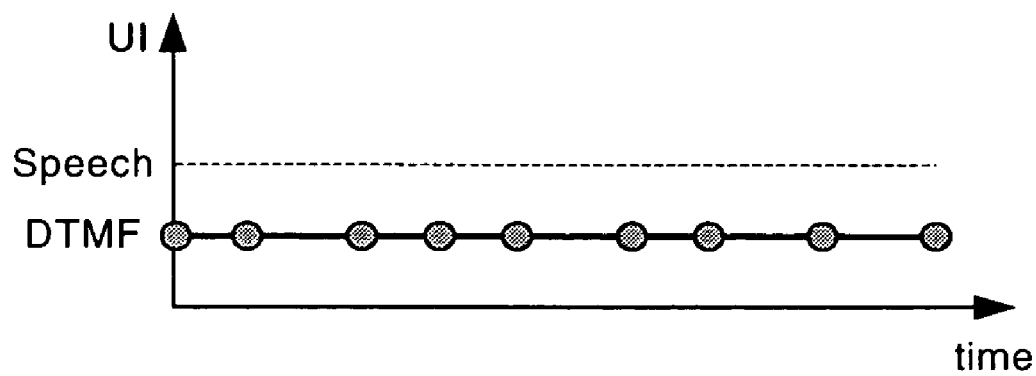
FIG. 1 is a time diagram representative of a DTMF only selection in accordance with this invention.

The following example is represented by the time diagram shown in FIG. 1.

Ex 1: Explicit switch for selecting a DTMF only interface.

An explicit "switch" could be provided at the beginning of the application for a user to switch explicitly to a DTMF interface.

System: Welcome to our automated <application name> system. To continue this application in DTMF mode, press one. Otherwise just wait for the next prompt.
User: (presses key "1").
System: For weather information, press 1. For news, press 2. For entertainment, press 3.

Following this selection, all user interactions with the system will continue in the DTMF mode. Plotted on a time diagram, the system behavior (user interaction) would look like that shown in FIG. 1.

Figure 2:
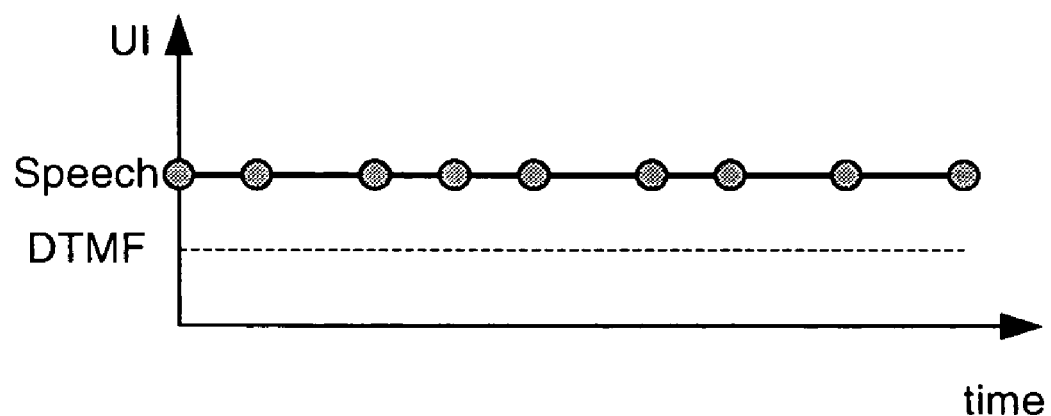
FIG. 2 is a time diagram representative of a speech only selection in accordance with this invention.

The following example is represented by the time diagram shown in FIG. 2.

Ex 2: Explicit switch for selecting a speech only interface.

An explicit "switch" could be provided at the beginning of the application for a user to continue with a speech interface.
System: Welcome to our automated <application name> system. To continue this application in DTMF mode, press one. Otherwise just wait for the next prompt.
User: (waits)
System: For weather information, say weather. For news information, say news. For movies and concerts, say entertainment.

Following this selection, all user interactions with the system will continue in speech mode. Plotted on a time diagram, the system behavior (user interaction) would look like that shown in FIG. 2.

Figure 3:
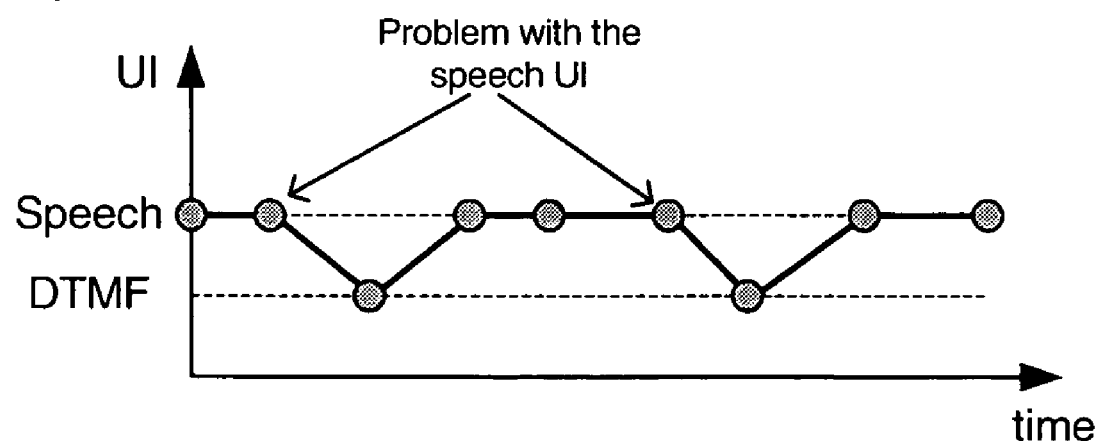
FIG. 3 is a time diagram wherein initially the system responds to speech and converts to DTMF when a problem occurs and back to speech when the problem clears in accordance with this invention.

The following example is represented by the time diagram shown in FIG. 3.

Ex 3: Implicit mixed interface alternating between DTMF and speech depending on speech response performance. If at design-time, the assumption is made that noise interferences might occur but the source of noise will disappear quickly, error recovery might resort to DTMF, but then revert back to speech. An implicit "switch" (rule that establishes the switch to a different interface—e.g., the second nomatch) could be provided that will expose the DTMF interface automatically when there is a temporary problem with the speech interface (either excessive noinput or nomatch events).
System: Welcome to our automated <application name> system. To continue this application in DTMF mode, press one. Otherwise just wait for the next prompt.
User: (waits)
System: For weather information, say weather. For news information, say news. For movies and concerts say entertainment.
User: Weather
System: Sorry, I didn't hear what you said.
User: Weather
System: The connection must be bad; please repeat what you said.
User: Weather
System: For weather information, press 1. For news, press 2. For entertainment, press 3.
User: (presses key "1")
System: The weather in Boca Raton is . . .
System: For weather information, say weather. For news information, say news. For movies and concerts, say entertainment.
User: News
System: The headlines for Tuesday, September second are
. . .

All user interactions with the system are initiated in speech mode but will resort to DTMF when needed. Plotted on a time diagram, the system behavior (user interaction) would look like that shown in FIG. 3.

Figure 4:
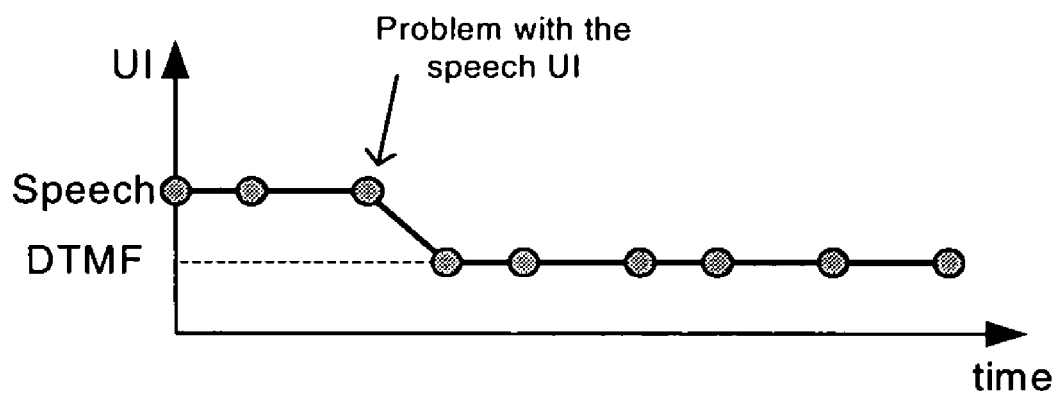
FIG. 4 is a time diagram representative of an application in which initially speech recognition is being used and in response to a problem with the speech recognition is changed to DTMF permanently in accordance with this invention.

The following example is represented by the time diagram shown in FIG. 4.

Ex 4: If the design assumption is that speech is the desirable interface, but if the environment is noisy then it is likely to remain so, a "switch" could be provided that will expose the DTMF interface automatically when there is a problem with the speech interface and all the following prompts will be presented in DTMF (in effect, a switch to a DTMF UI).
System: Welcome to our automated <application name> system. To continue this application in DTMF mode, press one. Otherwise just wait for the next prompt.
User: (waits)
System: For weather information, say weather. For news information, say news. For movies and concerts, say entertainment.
User: Weather
System: Sorry, I didn't hear what you said.
User: Weather
System: The connection must be bad; please repeat what you said.
User: Weather
System: For weather information, press 1. For news, press 2. For entertainment, press 3.
User: (presses key "1")
System: The weather in Boca Raton is . . .
System: For weather information, press 1. For news, press 2. For entertainment, press 3.
User: (presses key "2")
System: The headlines for Tuesday, September second are
. . .

All user interactions with the system are initiated in speech mode but will fall back permanently to a DTMF interface if the speech recognition is low. Plotted on a time diagram, the system behavior (user interaction) would look like that shown in FIG. 4.

Figure 5:
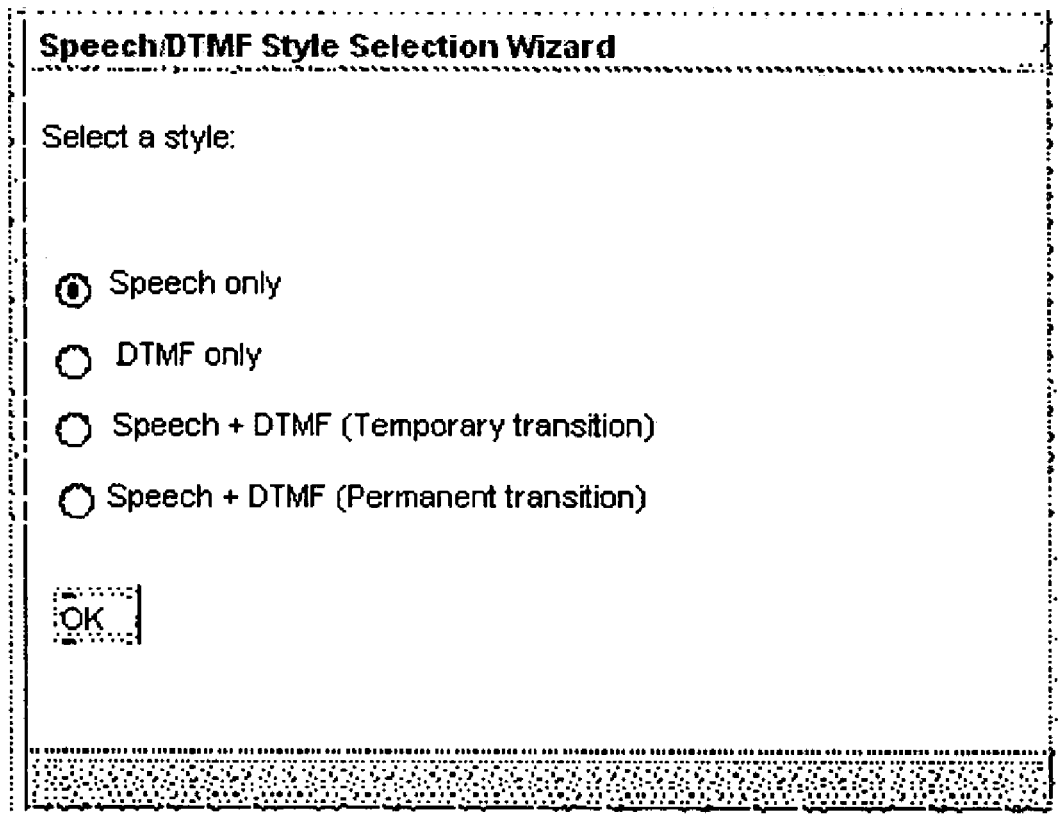
FIG. 5 is a computer screen illustrating the style-selection interface of the present invention.

FIG. 5 is a computer screen illustrating the style-selection interface of the present invention. It should be noted that within an automated code generation engine, the interaction styles can be chosen at design-time.

The present invention can be realized in hardware, software, or a combination of hardware and software. An implementation of the method and system of the present invention can be realized in a centralized fashion in one computer system, or in a distributed fashion where different elements are spread across several interconnected computer systems. Any kind of computer system, or other apparatus adapted for carrying out the methods described herein, is suited to perform the functions described herein.

A typical combination of hardware and software could be a general purpose computer system having a central processing unit and a computer program stored on a storage medium that, when loaded and executed, controls the computer system such that it carries out the methods described herein. The present invention can also be embedded in a computer program product, which comprises all the features enabling the implementation of the methods described herein, and which, when loaded in a computer system is able to carry out these methods. Storage medium refers to any volatile or non-volatile storage device.

Computer program or application in the present context means any expression, in any language, code or notation, of a set of instructions intended to cause a system having an information processing capability to perform a particular function either directly or after either or both of the following a) conversion to another language, code or notation; b) reproduction in a different material form. Significantly, this invention can be embodied in other specific forms without departing from the spirit or essential attributes thereof, and accordingly, reference should be had to the following claims, rather than to the foregoing specification, as indicating the scope of the invention.

We claim:

1. A method of defining standard speech/DTMF mixed user interface styles used in generating speech application code for managing the user interface (UI) presentation in applications that can support both speech recognition and DTMF telephone key input, the method comprising the steps of:

presenting a style-selection menu that allows for selection of one or more UI styles, each UI style corresponding to a system response to a code-generation request; and upon selection of a UI style, preparing the system response for a code-generation request, wherein the system response comprises a mixed speech and DTMF interface, wherein the interface permits only one mode of interaction to occur at any one time, and wherein a transfer from a speech interaction mode to a DTMF interaction mode occurs automatically responsive to a system detected problem with speech recognition of the speech interaction mode, wherein the different ones of the UI styles include a style for mixed speech and DTMF with temporary transitions and a style for mixed speech and DTMF with permanent transitions, wherein the interface of the system response for the mixed speech and DTMF with temporary transitions automatically transfers from the DTMF interaction mode to the speech interaction mode after a DTMF response is received and before a next prompt is presented, and wherein the interface of the system response for the mixed speech and DTMF with permanent transitions remains in the DTMF interaction mode until a user command to change to a different mode is received.

2. A system for managing standard speech/DTMF mixed user interface styles the system comprising a computer, the computer including a style-selection menu that allows for selection of one or more UI styles, each UI style corresponding to a system response to a code-generation request, wherein a selection includes a mixed speech and DTMF interface, wherein the interface permits only one mode of interaction to occur at any one time, and wherein a transfer from a speech interaction mode to a DTMF interaction mode occurs automatically responsive to a system detected problem with speech recognition of the speech interaction mode, wherein the different ones of the UI styles include a style for mixed speech and DTMF with temporary transitions and a style for mixed speech and DTMF with permanent transitions, wherein the interface of the system response for the mixed speech and DTMF with temporary transitions automatically transfers from the DTMF interaction mode to the speech interaction mode after a DTMF response is received and before a next prompt is presented, and wherein the interface of the system response for the mixed speech and DTMF with permanent transitions remains in the DTMF interaction mode until a user command to change to a different mode is received.

3. A machine readable storage medium storing a computer program which when executed defines standard speech/DTMF mixed user interface styles used in generating speech application code for managing the user interface (UI) presentation in applications that can support both speech recognition and DTMF telephone key input, comprising the steps of:

presenting a style-selection menu that allows for selection of one or more UI styles, each UI style corresponding to a system response to a code-generation request; and;

upon selection of a UI style, preparing the system response for a code-generation request, wherein the system response comprises a mixed speech and DTMF interface, wherein the interface permits only one mode of interaction to occur at any one time, and wherein a transfer from a speech interaction mode to a DTMF interaction mode occurs automatically responsive to a system detected problem with speech recognition of the speech interaction mode, wherein the different ones of the UI styles include a style for mixed speech and DTMF with temporary transitions and a style for mixed speech and DTMF with permanent transitions, wherein the interface of the system response for the mixed speech and DTMF with temporary transitions automatically transfers from the DTMF interaction mode to the speech interaction mode after a DTMF response is received and before a next prompt is presented, and wherein the interface of the system response for the mixed speech and DTMF with permanent transitions remains in the DTMF interaction mode until a user command to change to a different mode is received.

* * * * *